United States Patent
Kim et al.

(10) Patent No.: US 12,213,334 B2
(45) Date of Patent: Jan. 28, 2025

(54) ORGANIC EMITTING DIODE AND ORGANIC LIGHT EMITTING DIODE DISPLAY DEVICE INCLUDING THE SAME

(71) Applicant: LG Display Co., Ltd., Seoul (KR)

(72) Inventors: Hee-Jin Kim, Gyeonggi-do (KR); Hak-Min Lee, Gyeonggi-do (KR); Sung-Soo Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 549 days.

(21) Appl. No.: 17/519,499

(22) Filed: Nov. 4, 2021

(65) Prior Publication Data

US 2022/0059794 A1 Feb. 24, 2022

Related U.S. Application Data

(62) Division of application No. 15/354,178, filed on Nov. 17, 2016, now abandoned.

(30) Foreign Application Priority Data

Nov. 30, 2015 (KR) .................. 10-2015-0169502

(51) Int. Cl.
| | |
|---|---|
| *H01L 51/50* | (2006.01) |
| *H10K 50/11* | (2023.01) |
| *H10K 50/165* | (2023.01) |
| *H10K 50/17* | (2023.01) |
| *H10K 50/81* | (2023.01) |
| *H10K 50/82* | (2023.01) |
| *H10K 59/12* | (2023.01) |
| *H10K 59/35* | (2023.01) |
| *H10K 71/00* | (2023.01) |
| *H10K 71/12* | (2023.01) |
| *H10K 71/13* | (2023.01) |
| *H10K 101/00* | (2023.01) |
| *H10K 101/10* | (2023.01) |
| *H10K 101/30* | (2023.01) |
| *H10K 101/40* | (2023.01) |

(52) U.S. Cl.
CPC .......... *H10K 50/165* (2023.02); *H10K 50/11* (2023.02); *H10K 50/171* (2023.02); *H10K 50/81* (2023.02); *H10K 50/82* (2023.02); *H10K 59/12* (2023.02); *H10K 59/35* (2023.02); *H10K 71/00* (2023.02); *H10K 71/12* (2023.02); *H10K 71/13* (2023.02); *H10K 2101/10* (2023.02); *H10K 2101/30* (2023.02); *H10K 2101/40* (2023.02); *H10K 2101/80* (2023.02)

(58) Field of Classification Search
None
See application file for complete search history.

(56) References Cited

U.S. PATENT DOCUMENTS

| | | |
|---|---|---|
| 2002/0121860 A1 | 9/2002 | Seo et al. |
| 2003/0151568 A1 | 8/2003 | Ozawa |
| 2004/0207312 A1 | 10/2004 | Takashima et al. |
| 2005/0260440 A1 | 11/2005 | Seo et al. |
| 2006/0250076 A1 | 11/2006 | Hofmann et al. |
| 2007/0035235 A1* | 2/2007 | Liu .............. H10K 50/171 313/504 |
| 2010/0019232 A1 | 1/2010 | Lee et al. |
| 2011/0284825 A1 | 11/2011 | Yang et al. |
| 2012/0223633 A1 | 9/2012 | Yoshinaga et al. |
| 2012/0241729 A1 | 9/2012 | Philippens et al. |
| 2012/0267619 A1 | 10/2012 | Yamada et al. |
| 2013/0207084 A1 | 8/2013 | Im et al. |
| 2013/0285022 A1 | 10/2013 | Su et al. |

FOREIGN PATENT DOCUMENTS

| | | |
|---|---|---|
| CN | 1753592 A | 3/2006 |
| JP | H05-182762 A | 7/1993 |
| JP | 2002-299061 A | 10/2002 |
| JP | 2004-247279 A | 9/2004 |
| JP | 2006-295192 A | 10/2006 |
| JP | 2011-61016 A | 3/2011 |
| KR | 10-2008-0075480 A | 8/2008 |
| KR | 10-2013-0092725 A | 8/2013 |
| TW | 545080 B | 8/2003 |
| TW | 200708179 A | 2/2007 |
| TW | 280814 B | 5/2007 |
| TW | I483441 B | 5/2015 |
| WO | 2006/070619 A1 | 7/2006 |
| WO | 2011/092939 A1 | 8/2011 |

OTHER PUBLICATIONS

Office Action dated Sep. 26, 2017, issued in corresponding Japanese Application No. 2016-228775.
Office Action dated Oct. 19, 2016, for corresponding Korean Patent Application No. 10-2015-0169502.
Extended European Search Report dated Apr. 21, 2017 for corresponding European Patent Application No. 16201030.0.
Chen Zhi Bo, "Synthesis and Characterization of Ambipolar Aryl-Substituted Pyrrole Fluorophores", Master's Thesis Department of Applied Chemistry, National University of Kaohsung.
Huang He Long, "Progress of OLED Electron and Hole Transport Material", 1TR1 Materialsnet, Jun. 15, 2010, http:// www.materialsnet.com.tw/DocView.aspx?id-8642.
Office Action dated Jun. 9, 2017, issued in corresponding Taiwanese Patent Application No. 105134329.

(Continued)

*Primary Examiner* — Gregory D Clark
(74) *Attorney, Agent, or Firm* — Morgan, Lewis & Bockius LLP

(57) ABSTRACT

The present invention provides an organic emitting diode including a first electrode; a second electrode facing the first electrode; an emitting material layer between the first and second electrodes; and an intervening layer between the emitting material layer and the second electrode and including a base material and an electron injection material, wherein the intervening layer contacts the second electrode.

6 Claims, 9 Drawing Sheets

(56) References Cited

OTHER PUBLICATIONS

Chinese Office Action dated Mar. 14, 2018, issued in corresponding Chinese Application No. 201611036426.8.
Japanese Office Action dated Jun. 5, 2018, issued in corresponding Japanese Application No. 2016-228775.

* cited by examiner

ORGANIC EMITTING DIODE AND ORGANIC LIGHT EMITTING DIODE DISPLAY DEVICE INCLUDING THE SAME

The present application is a divisional of U.S. patent application Ser. No. 15/354,178, filed on Nov. 17, 2016, which claims the benefit of Korean Patent Application No. 10-2015-0169502, filed in Korea on Nov. 30, 2015, the entirety of each of which is hereby incorporated by reference.

BACKGROUND OF THE INVENTION

Field of the Invention

The present invention relates to an organic light emitting diode (OLED) display device, and more particularly, to an organic emitting diode and an OLED display device having an improved emitting efficiency and a simple structure.

Discussion of the Related Art

Flat panel display (FPD) devices having a light weight and a thin profile is widely researched or used instead of a cathode ray tube (CRD).

Among these FPD devices, a liquid crystal display (LCD) device has been widely used. However, the LCD device as a non-self emission type display device has disadvantages in brightness, contrast ratio and a viewing angle, the OLED display device is newly researched.

Since the OLED display device is a self-emission type display device without a backlight unit, the OLED display device has advantages in weight and thickness. In addition, the OLED display device has excellent characteristic in a viewing angle, contrast ratio, a response time, power consumption, and so on.

FIG. 1 is a diagram illustrating an emission mechanism of an OLED display device.

Referring to FIG. 1, the OLED display device includes an organic emitting diode. The organic emitting diode may include a first electrode 18 as an anode, a second electrode 28 as a cathode and first to fifth organic layers 30a, 30b, 30c, 30d and 30e between the first and second electrodes 18 and 28.

The first to fifth organic layers 30a to 30e respectively serve as a hole injection layer (HIL) 30a, a hole transporting layer (HTL) 30b, an emitting material layer (EML) 30c, an electron transporting layer (ETL) 30d and an electron injection layer (EIL) 30e.

When positive and negative voltages are respectively applied to the first and second electrodes 18 and 28, holes and electrons from the first and second electrodes 18 and 28 are transported into and combined in the EML 30c to form an exciton. The exciton is transited from an excited state into a ground state (i.e., a stable state) such that the light is emitted from the organic emitting diode.

In the OLED display device, sub-pixels including the organic emitting diode are arranged in a matrix shape, and an image is displayed by selectively controlling the sub-pixels.

The OLED display device may be classified into a passive matrix type and an active matrix type. In the active matrix type OLED display device, a thin film transistor is turned on and off to select the sub-pixel, and the emission of the sub-pixel is maintained by a voltage in a storage capacitor.

Generally, the organic emitting diode is fabricated by a deposition process. Namely, a material to be deposited is evaporated in a deposition chamber such that a target layer is deposited on a substrate.

However, in the deposition process, a size of the deposition chamber should be larger than that of the substrate. In addition, additional space is required for input/output of the substrate. Accordingly, there is a limitation in the deposition process for a large-size display device.

To overcome the limitation in the deposition process, a solution process is introduced.

FIG. 2 is a cross-sectional view of the related art organic emitting diode fabricated by a solution process.

Referring to FIG. 2, the organic emitting diode includes a first electrode 18, an emitting part 30 and a second electrode 28 stacked on a substrate 1.

The emitting part 30 includes an HTL 30b, an ETL 30d and an EML 30c therebetween. To improve the emitting efficiency, an HIL 30a is formed between the first electrode 18 and the HTL 30b, and an ETL 30e is formed between the second electrode 28 and the ETL 30d.

A part of the emitting part 30 is fabricated by a solution process to be separated in red, green and blue sub-pixels R, G and B. The HIL 30a, the HTL 30b, the EML 30c are formed by the solution process. However, since the materials of the ETL 30d and the EIL 30e have insufficient stability to the solution process, the ETL 30d and the ETL 30e are formed by a deposition process.

The ETL 30d and the ETL 30e are required to improve the emitting efficiency of the organic emitting diode by efficiently injecting and/or transporting the electron into the EML 30c.

On the other hand, the EIL 30e, which includes sodium fluoride (NaF), may be formed on the EML 30c without the ETL 30d. In this instance, the material of the ETL 30e is diffused into the EML 30c such that the electron injection is increased.

However, since a portion of the EML 30c is changed into a non-emission part by diffusion of material of the ETL 30e, a thickness of the EML 30c should be increased to be over a pre-determined thickness. As a result, the driving voltage for the organic emitting diode is increased, and there is a limitation in the solution process to increase the thickness of the EML 30c.

Namely, the Na+ ion of the ETL 30e is diffused into the EML 30c such that the electron transporting property is increased, while the emitting efficiency is decreased by the Na+ ion diffused portion of the EML 30c. To prevent the decrease of the emitting efficiency, it is required to increase the thickness of the EML 30c. However, the driving voltage for the organic emitting diode is increased by the thickness increase of the EML 30c. In addition, since the viscosity of the solution for the solution process should be increase to increase the thickness of the EML 30c, the coating property is decreased.

SUMMARY

Accordingly, the present invention is directed to an organic emitting diode and an OLED display device including the same that substantially obviate one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an organic emitting diode comprises a first electrode; a second electrode facing the first electrode; an emitting material layer between the first and second electrodes; and an intervening layer between the emitting material layer and the second electrode and including a base material and an electron injection material, wherein the intervening layer contacts the second electrode.

In another aspect, an organic light emitting diode display device comprises a substrate including a plurality of sub-pixels; a transistor in each sub-pixel; and an organic emitting diode positioned in each sub-pixel and connected to the transistor, the organic emitting diode including: a first electrode; a second electrode facing the first electrode; an emitting material layer between the first and second electrodes; and an intervening layer between the emitting material layer and the second electrode and including a base material and an electron injection material, wherein the intervening layer contacts the second electrode.

In another aspect, a method for manufacturing an organic emitting diode comprises forming a first electrode; forming an emitting material layer on the first electrode; forming an intervening layer including a base material and an electron injection material on the emitting material layer; and forming a second electrode on the intervening layer to contact the intervening layer, wherein the emitting material layer and the intervening layer are formed by solution process.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

In the present specification, when a first element is referred to as being "on" a second element, it can be directly on the upper surface of the second element or a third intervening element may also be present.

Reference will now be made in detail to the preferred embodiments, examples of which are illustrated in the accompanying drawings.

Figure 1:
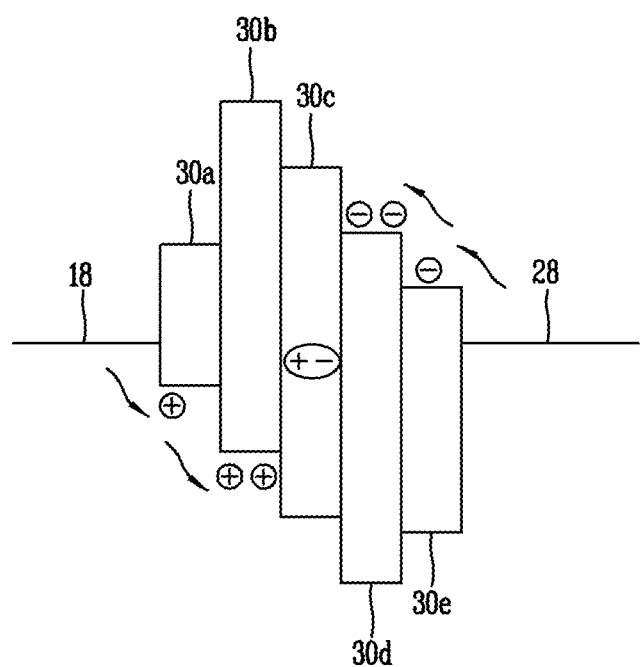
FIG. 1 is a diagram illustrating an emission mechanism of an OLED display device.
Figure 2:
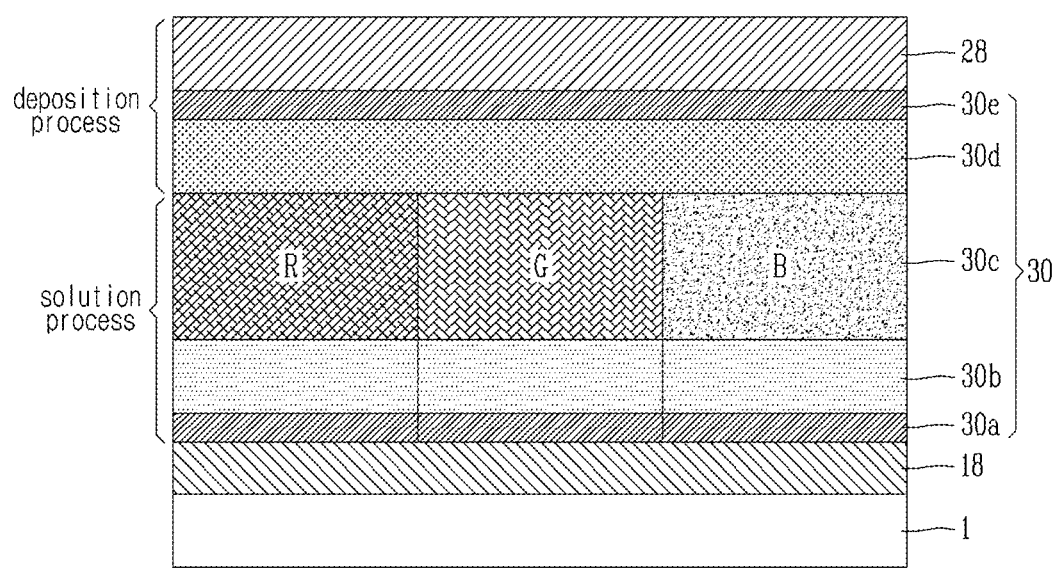
FIG. 2 is a cross-sectional view of the related art organic emitting diode fabricated by a solution process.
Figure 3:
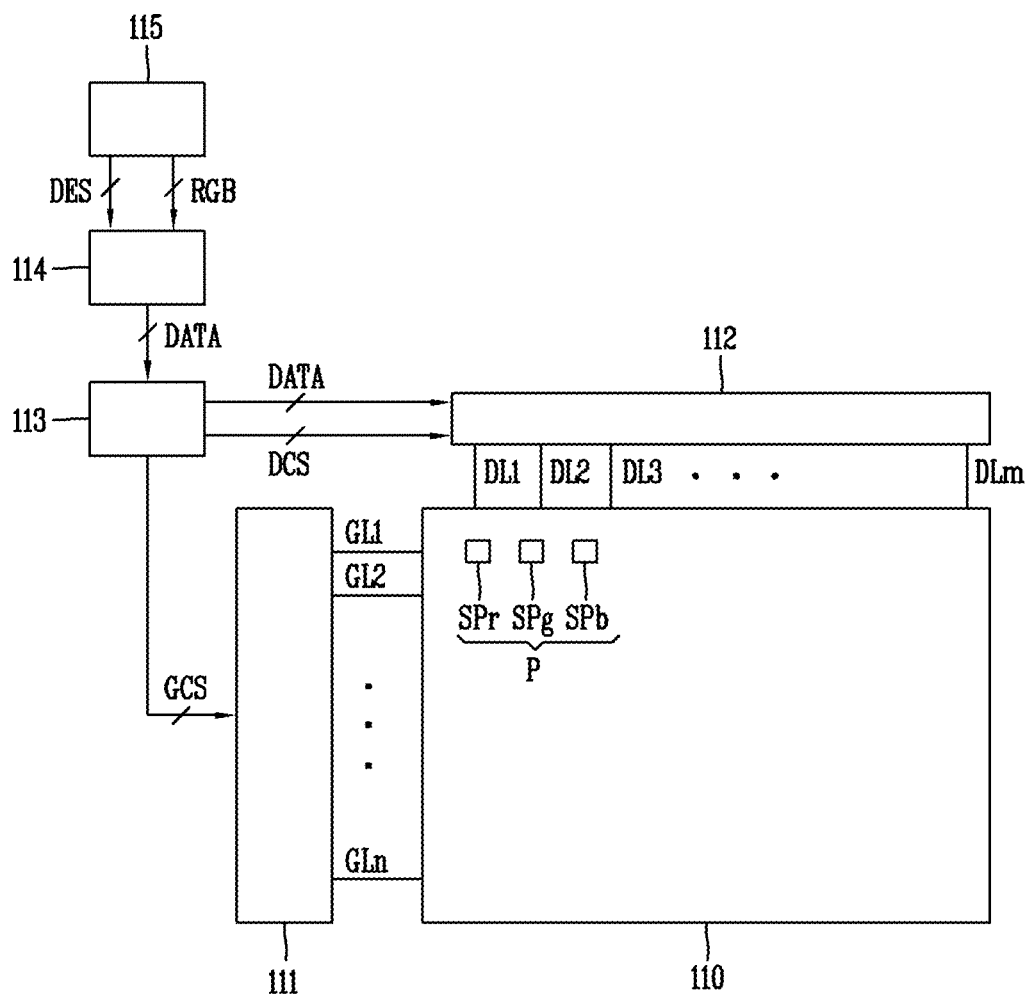
FIG. 3 is a schematic block diagram illustrating an OLED display device according to the present invention.

FIG. 3 is a schematic block diagram illustrating an OLED display device according to the present invention.

Referring to FIG. 3, the OLED display device includes an image treating unit 115, a data conversion unit 114, timing controller 113, a data driver 112, a gate driver 111 and a display panel 110.

The image treating unit 115 performs various image treating processes, e.g., setting a gamma voltage for providing a maximum brightness according to an average image level, using the RGB data signals and outputs the treated RGB data. In addition, the image treating unit 115 outputs a driving signal including at least one of a vertical sync signal (Vsync), a horizontal sync signal (Hsync), a data enable signal (DES) and a clock signal (CLK).

The timing controller 113 receives the driving signal including at least one of the Vsync, the Hsync, the DES and the CLK. The timing controller 113 outputs a gate timing control signal GCS for controlling an operation timing of the gate driver 111 and a data timing control signal DCS for controlling an operation timing of the data driver 112 according to the driving signal. In addition, the timing controller 113 outputs a data signal DATA corresponding to the GCS and the DCS.

In response to the DCS, the data driver 112 is performed a sampling process of the DATA from the timing controller 113 to output a gamma reference voltage. The data driver 112 outputs modified DATA to the data lines DL1 to DLm. The data driver 112 includes an integrated circuit (IC).

In response to the GCS from the timing controller 113, the gate driver 111 shifts a level of a gate voltage and outputs a gate signal. The gate driver 111 outputs the gate signal to the gate lines GL1 to GLn. The gate driver 111 includes an IC or is installed on the display panel 110 in a gate-in-panel (GIP) type.

The display panel 110 may includes a red sub-pixel SPr, a green sub-pixel SPg and a blue sub-pixel SPb. Namely, one pixel P may include the red, green and blue sub-pixels SPr, SPg and SPb, but it is not limited thereto. For example, the pixel P may further include a white sub-pixel.

Figure 4:
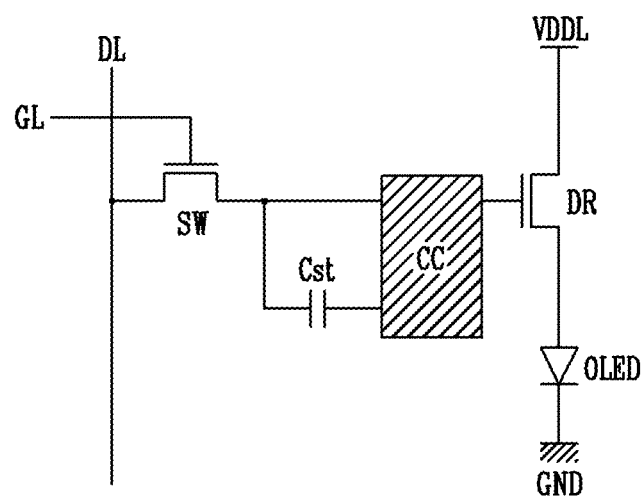
FIG. 4 is a circuit diagram of a sub-pixel in an OLED display device according to the present invention.

FIG. 4 is a circuit diagram of a sub-pixel in an OLED display device according to the present invention.

In FIG. 4, the sub-pixel includes a switching transistor, a driving transistor and a capacitor with an organic emitting diode. Namely, the sub-pixel has a 2-transistor-1-capacitor (2T1C) structure. Alternatively, the sub-pixel may have a 3T1C structure, a 4T2C structure or a 5T2C structure.

Referring to FIG. 4, in the OLED display device, a sub-pixel region is defined by a gate line GL, a data line DL and a power line VDDL. The gate line GL extends along a first direction, and each of the data line DL and the power line VDDL extend along a second direction to cross the gate line GL. The data line DL and the power line VDDL are spaced apart from each other to be parallel to each other.

In each sub-pixel, the switching transistor SW, the driving transistor DR, the capacitor Cst, a compensation circuit CC and the organic light emitting diode OLED.

The organic emitting diode is operated to emit the light according to a driving current through the driving transistor DR. The switching transistor SW is switched to store the data signal, which is provided through the data line DL according to the gate signal provided through the data line GL, into the capacitor Cst as a data voltage. The driving transistor DR is operated to provide the signal of the power line VDDL to the ground GND according to the data voltage in the capacitor Cst. The threshold voltage of the driving transistor DR is compensated by the compensation circuit CC. For example, the compensation circuit CC may include at least one transistor and at least one capacitor, but it is not limited thereto.

The OLED display device may be classified into a top emission type, a bottom emission type or a dual emission type according to an emitting direction of the light.

Figure 5:
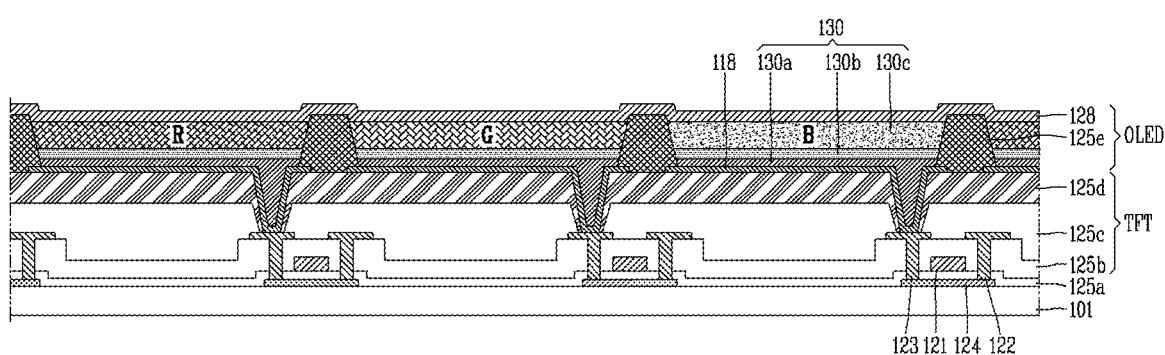
FIG. 5 is a cross-sectional view of an OLED display device according to the present invention.
Figure 6:
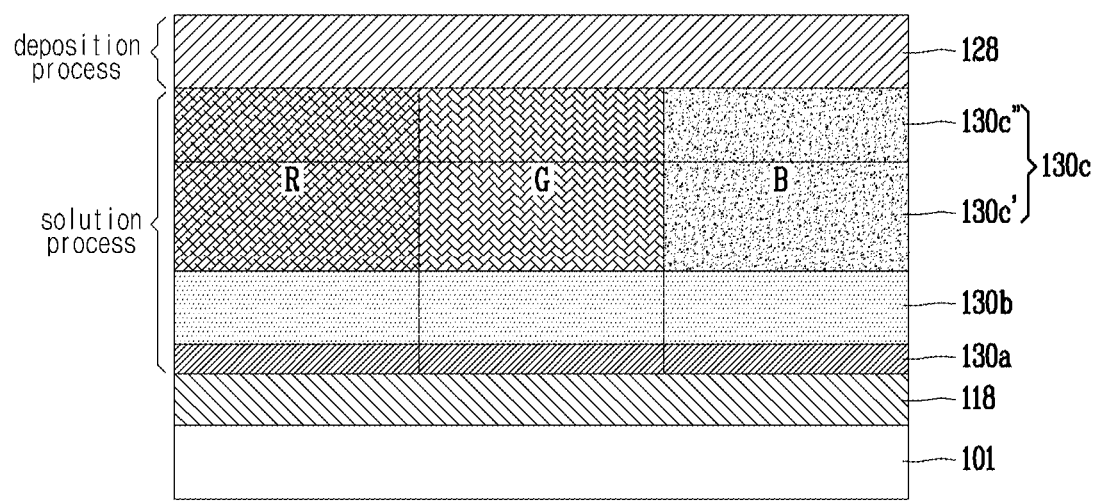
FIG. 6 is a cross-sectional view of an organic emitting diode according to the present invention.

FIG. 5 is a cross-sectional view of an OLED display device according to the present invention, and FIG. 6 is a cross-sectional view of an organic emitting diode according to the present invention.

In FIG. 5, one pixel includes the red, green and blue (RGB) sub-pixels. The OLED display device in FIG. 5 will be explained in the bottom emission type. Namely, the light from the organic emitting diode passes through a substrate 101 to display image. Alternatively, the light from the organic emitting diode may pass a second electrode 128 (top emission type). In addition, the light from the organic emitting diode may pass both the substrate 101 and the second electrode 128 (dual emission type).

In FIG. 5, the OLED display device includes a thin film transistor of a coplanar structure, but it is not limited thereto.

Referring to FIGS. 5 and 6, the OLED display device includes a transistor TFT on the substrate 101 and an organic emitting diode OLED over the substrate 101.

For example, the substrate 101 may be divided into the red, green and blue sub-pixels R, G and B, and the R, G and B sub-pixels may be regularly repeated in each line direction or in a diagonal direction.

The transistor TFT as a driving thin film transistor includes a semiconductor layer 124, a gate electrode 121, a source electrode 122 and a drain electrode 123.

The semiconductor layer 124 is formed on the substrate 101 being formed of an insulating material such as a transparent plastic or a transparent polymer film.

The semiconductor layer 124 may be formed of amorphous silicon, a poly-silicon, an oxide semiconductor or an organic semiconductor.

A buffer layer (not shown) may be formed between the substrate 101 and the semiconductor layer 124. The transistor TFT is protected from impurities, e.g., alkali ion, from the substrate 101 by the buffer layer.

A gate insulating layer 125a is formed on the semiconductor layer 124. For example, the gate insulating layer 125a may be formed of an inorganic insulating material such as silicon oxide or silicon nitride. The gate electrode 121, a gate line (not shown) and a first capacitor electrode (not shown) are formed on the gate insulating layer 125a. The gate electrode 121 corresponds to the semiconductor layer 124.

Each of the gate electrode 121, the gate line and the first capacitor electrode is formed of a first metallic material having low resistance. For example, each of the gate electrode 121, the gate line and the first capacitor electrode may be formed of at least one of aluminum (Al), copper (Cu), molybdenum (Mo), chromium (Cr), gold (Au), titanium (Ti), nickel (Ni), neodymium (Nd) and their alloys and may have a single-layered structure or a multi-layered structure.

An interlayer insulating layer 125b, which is formed of an inorganic material such as silicon oxide or silicon nitride, is formed on the gate electrode 121, the gate line and the first capacitor electrode, and a data line (not shown), a power line (not shown), the source electrode 122, the drain electrode 123 and a second capacitor electrode (not shown) are formed on the interlayer insulating layer 125b.

The source and drain electrodes 122 and 123 are spaced apart from each other and electrically connected to the semiconductor layer 124, respectively. For example, first and second semiconductor contact holes are formed through the gate insulating layer 125a and the interlayer insulating layer 125b to expose both ends of the semiconductor layer 124, and the source and drain electrodes 122 and 123 contact the semiconductor layer 124 through the first and second semiconductor contact holes, respectively.

The second capacitor electrode overlaps the first capacitor electrode with the interlayer insulating layer 125b therebetween to form a storage capacitor.

Each of the data line, the power line, the source electrode 122, the drain electrode 123 and the second capacitor electrode may be formed of a second metallic material having low resistance. For example, each of the data line, the power line, the source electrode 122, the drain electrode 123 and the second capacitor electrode may be formed of at least one of Al, Cu, Mo, Cr, Au, Ti, Ni, Nd and their alloys and may have a single-layered structure or a multi-layered structure.

A passivation layer (or a planarization layer) 125c is formed over the substrate 101 including the data line, the power line, the source electrode 122, the drain electrode 123 and the second capacitor electrode, and an overcoat layer 125d is formed on the passivation layer 125c. A drain contact hole exposing the drain electrode 123 is formed through the overcoat layer 125d and the passivation layer 125c.

The passivation layer 125c may be formed of an organic material, an inorganic material or their mixture. When the passivation layer 125c has a function of the overcoat layer, the overcoat layer 125d may be omitted.

The organic emitting diode OLED including a first electrode 118, an emitting part 130 and a second electrode 128 is formed on the overcoat layer 125d.

The organic emitting diode OLED is electrically connected to the driving thin film transistor TFT. In more detail, the first electrode 118 on the overcoat layer 125d is electrically connected to the drain electrode 123 of the driving thin film transistor TFT through the drain contact hole.

The first electrode 118 providing a current (or a voltage) to the emitting part 130 defines an emission region of a pre-determined area.

The first electrode 118 includes a relatively high work function to serve as an anode. For example, the first electrode 118 may include a transparent conductive material, e.g., indium-tin-oxide (ITO) or indium-zinc-oxide (IZO), but it is not limited thereto.

In FIG. 5, the first electrodes 118 in the R, G and B sub-pixel are separated from each other. Alternatively, the first electrodes 118 in the R, G and B sub-pixel are integrated to have one-body.

A bank 125e is formed over the substrate 101 including the first electrode 118. The bank 125e covers edges of the first electrode 125e to surround the sub-pixel. Namely, the bank 125e has an opening in correspondence to a center of the first electrode 118. The bank 125e may include an organic material. The bank 125e may be formed of a photo-sensitive material including a black pigment to serve as a light shielding element.

The emitting part 130 and the second electrode 128 are sequentially formed over the substrate 101 including the bank 125e.

The emitting part 130 is disposed between the first and second electrodes 118 and 128. The holes from the first electrode 118 and the electrons from the second electrode 128 are combined in the emitting part 130 such that the emitting part 130 emits.

The emitting part 130 includes an HTL 130b as an auxiliary layer and an EML 130c as a light emitting layer. The HTL 130b may have a single-layered structure or a multi-layered structure. To improve the emitting efficiency, the emitting part 130 may further include an HIL 130a between the first electrode 118 and the HTL 130b.

The EML 130 includes a first emitting layer 130c' having an improved interface property with the HTL 130b and a second emitting layer 130c" (referred to as "intervening layer" in another embodiment) having an improved electron injection property. An electron injection material is added into the emitting material of the EML 130 to form the second emitting layer 130c".

Namely, the first emitting layer 130c' includes a material improving the interface property with the HTL 130b to increase a lifetime of the organic emitting diode OLED. On the other hand, the second emitting layer 130c" includes the emitting injection material to have an improved electron injection property such that the emitting efficiency of the organic emitting diode OLED is increased.

Figure 13:
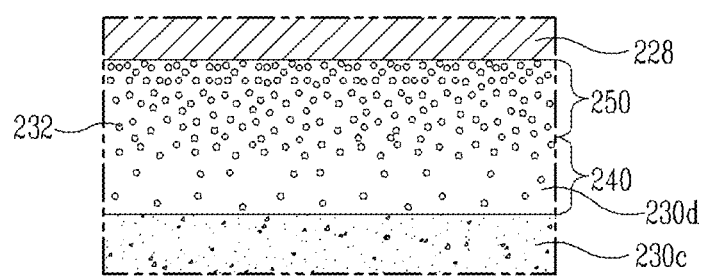
FIG. 13 is an enlarged view of portion "A" in FIG. 12.

The electron injection material may have a concentration (or density) gradient in the second emitting layer 130c" as explained with FIG. 13. Namely, the electron injection material in a lower portion, which is adjacent to the first emitting layer 130c', of the second emitting layer 130c" may have a first concentration (or density) with respect to the emitting material in the second emitting layer 130c", and the electron injection material in an upper portion, which is adjacent to the second electrode 128, of the second emitting layer 130c" may have a second concentration (or density), which is larger than the first concentration (or density), with respect to the emitting material in the second emitting layer 130c".

The second emitting layer 130c" is formed by a solution process using a solvent being damage-less to the first emitting layer 130c'. Accordingly, since the electron injection property is improved by the second emitting layer 130c", the emitting efficiency of the organic emitting diode OLED is increased without the ETL and the EIL.

For example, the electron injection material may include water-soluble or fat-soluble alkali metal. When the first emitting layer 130c' is formed using an organic solvent (i.e., fat-soluble), the second emitting layer 130c" is formed using the water-soluble material to prevent damages on the first emitting layer 130c'. Alternatively, when the first emitting layer 130c' is formed using the water-soluble solvent, the second emitting layer 130c" is formed using the organic solvent (i.e., fat-soluble solvent) to prevent damages on the first emitting layer 130c'.

The second emitting layer 130c" has a relatively low lowest unoccupied molecular orbital (LUMO) energy level, e.g., about 3.0 eV to 2.6 eV, and a triplet energy level (T1) of about 2.0 eV to about 2.5 eV. In addition, the second emitting layer 130c" has an electron mobility of about $10^{-6}$ $cm^2/Vs$ to about $10^{-4}$ $cm^2/Vs$.

In the organic emitting diode OLED of the present invention, since the electron from the second electrode 128 is securely transported into the EML 130c without the ETL and the EIL, the OLED has sufficient emitting efficiency and lifetime with a simple structure.

Namely, the problems, which is generated by diffusion of a material in the ETL and/or ETL into the EML in the related art organic emitting diode, is prevented in the organic emitting diode OLED and the OLED display device.

The emitting part 130 is fabricated in the R, G and B sub-pixels by a solution process. Namely, a low molecular or high molecular polymer material is coated on the first electrode 130 to form the emitting part 130.

In the emitting part 130, the HIL 130a may be omitted. Alternatively, the HIL 130a and the HTL 130b may be formed by one layer with a mixed material. In addition, at least one of the HIL 130a and the HTL 130b may have at least double-layered structure.

The EML 130c in the R, G and B sub-pixels includes a fluorescent emitting material or a phosphorescent emitting material. In addition, the EML 130c may include at least one host and at least one dopant.

The solution process for the emitting part 130 may be one of an inject printing process, a nozzle printing process, a transferring process, a thermal jet printing process a roll printing process, a gravure printing process and a spin coating process. However, it is not limited thereto.

The solution process can be performed without a mask or a chamber. Accordingly, since the solution process is simpler and the process cost is cheaper in comparison to the deposition process, the process time and the production cost for the organic emitting diode and the OLED display device are reduced.

In addition, since the ETL and the EIL, which are fabricated by the deposition process, can be omitted, the production yield of the organic emitting diode and the OLED display device is increased.

Figure 7A:
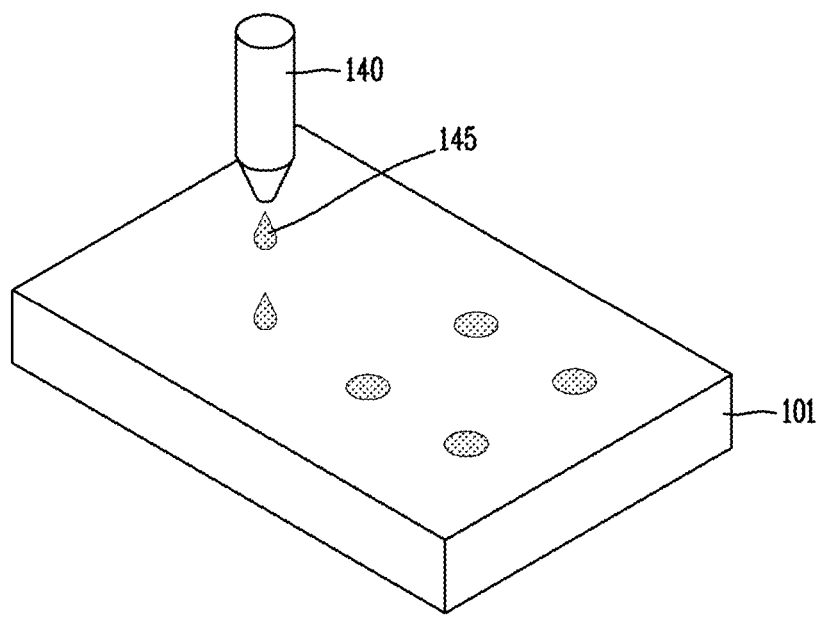
FIGS. 7A and 7B are views illustrating a solution process for an organic emitting diode according to the present invention.
Figure 7B:
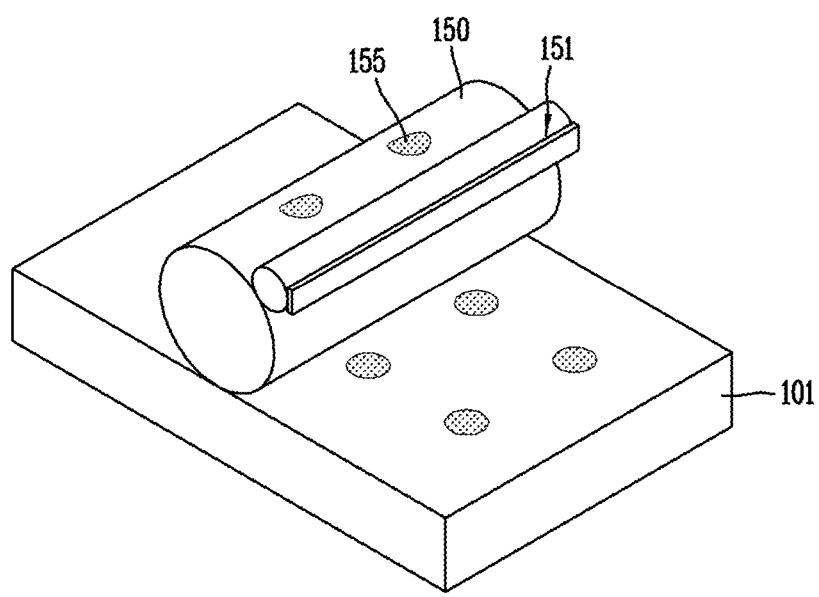

FIGS. 7A and 7B are views illustrating a solution process for an organic emitting diode according to the present invention.

FIG. 7A shows the inkjet printing process. As shown in FIG. 7A, an inkjet apparatus (not shown) including a head 140 is disposed over the substrate 101, and an ink is printed on the substrate 140. The head 140 includes a jetting hole for ink jetting.

In this instance, the head 140 or the substrate 101 is moved along at least one direction during the ink jetting such that the ink 145 is selectively printed in the sub-pixels.

In the nozzle printing process, at least one nozzle having a slit shape is used to print the ink on the substrate. In comparison to the inkjet printing process, the nozzle printing process is adequate to a large size substrate. For example, a layer is printed over the substrate 101, where the bank is formed, by an entire-surface nozzle printing process.

FIG. 7B shows the roll printing process. As shown in FIG. 7B, a main roller 150, where a pattern 155 is formed, is rotated on the substrate 101 to form a printing pattern. In this instance, an auxiliary roller 151 is connected to a head providing a printing solution such that the printing solution is continuously provided into the pattern 155 on the main roller 150. Without the pattern 155, the material may be printed or coated on an entire surface of the substrate 101.

Referring again to FIGS. 5 and 6, the second electrode 128 is formed on the emitting part 130, and the electron is provided from the second electrode 128 into the emitting part 130.

The second electrode 128 is formed on an entire surface of the substrate 101. Namely, the second electrodes 128 in the sub-pixels are integrated as one-body.

Figure 8:
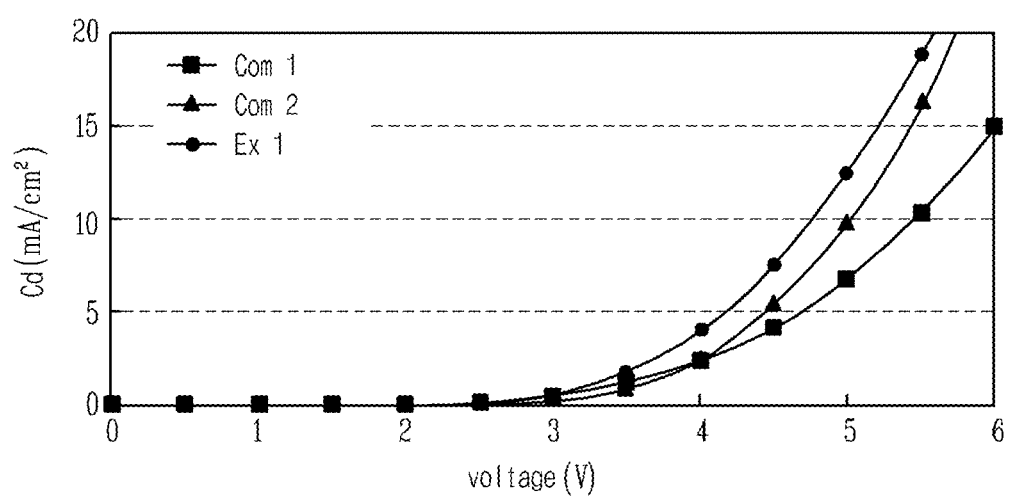
FIG. 8 is a graph of a current density according to a voltage in an organic emitting diode.
Figure 9:
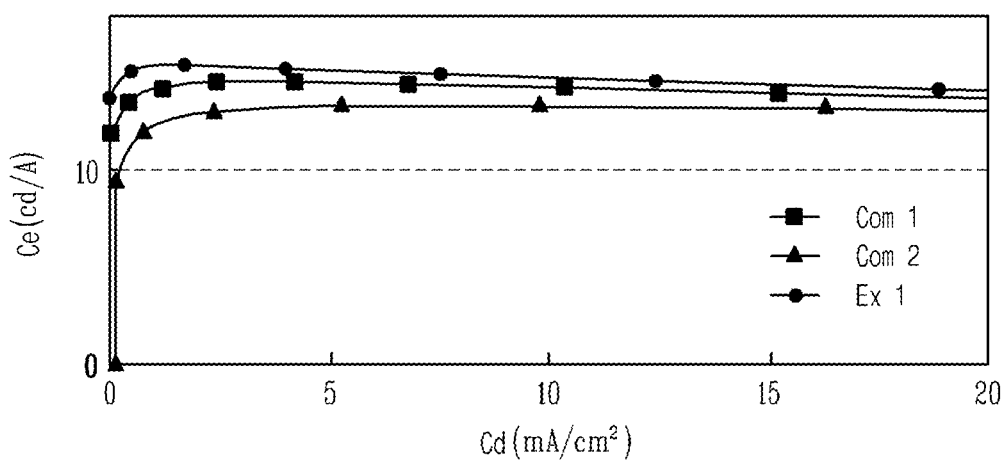
FIG. 9 is a graph of a current efficiency according to a current density in an organic emitting diode.
Figure 10:
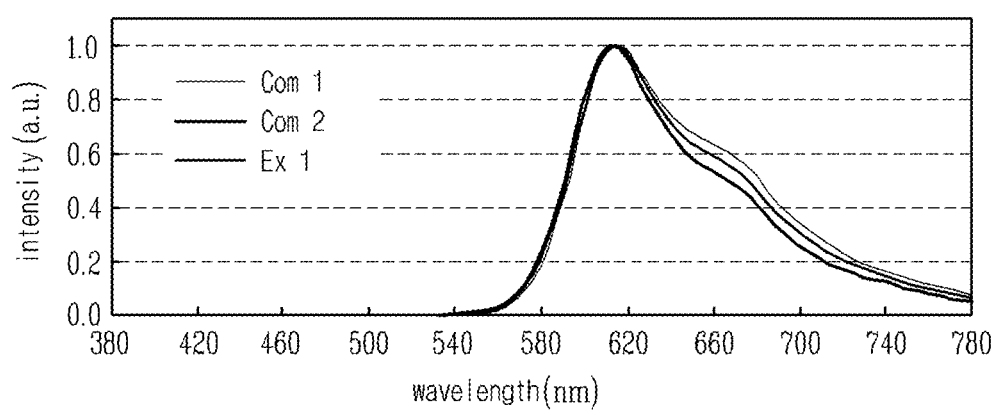
FIG. 10 is a graph of a light intensity according to a light wavelength in an organic emitting diode.

FIG. 8 is a graph of a current density according to a voltage in an organic emitting diode, FIG. 9 is a graph of a current efficiency according to a current density in an organic emitting diode, and FIG. 10 is a graph of a light intensity according to a light wavelength in an organic emitting diode. The graph in FIG. 10 is obtained in the red sub-pixel.

In FIGS. 8 to 10, the organic emitting diode of the comparative example 1 (Com1) includes an electron injection layer (EIL) without an electron transporting layer (ETL), and the organic emitting diode of the comparative example 2 (Com2) includes both an ETL and an ETL.

Referring to FIG. 8, a current density (Cd) in the organic emitting diode of "Com1" is lower at the same voltage than that in the organic emitting diode of "Com2". A current density (Cd) of the organic emitting diode of the example 1 (Ex1) including the first and second emitting layers 130c' and 130c" without the ETL and the ETL is higher than that in the organic emitting diode of "Com1" and "Com2". Namely, the driving efficiency of the organic emitting diode of the present invention is improved, and the driving voltage of the organic emitting diode of the present invention is decreased.

Referring to FIG. 9, a current efficiency (Ce) of the organic emitting diode of the example 1 (Ex1) is higher than that in the organic emitting diode of "Com1" and "Com2". It means that the lifetime of the organic emitting diode in the present invention is increased.

Referring to FIG. 10, in the organic emitting diode of "Com1", the emitting injection material in the ETL is diffused into the EML such that an emission region is shifted. As a result, there is a peak in a wavelength above a red wavelength, i.e., 600-650 nm). However, in the organic emitting diode of "Com1" and "Ex1", the peak shift problem is reduced such that a color purity is improved.

Figure 11:
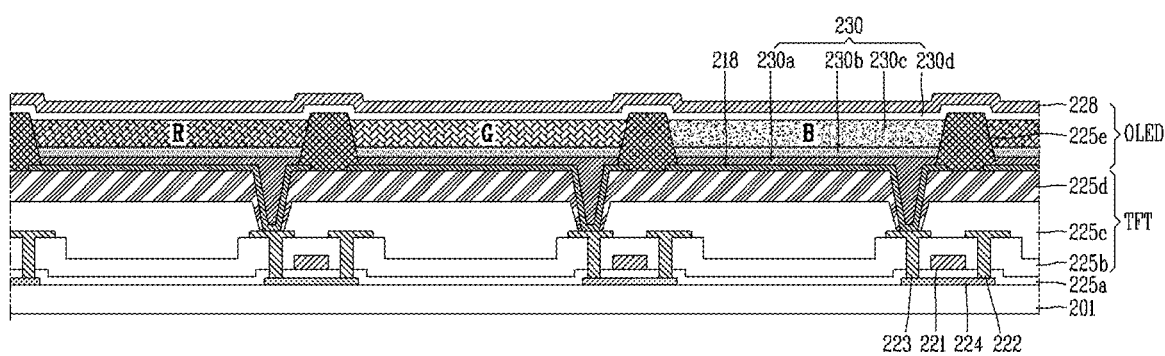
FIG. 11 is a cross-sectional view of an OLED display device according to the present invention.
Figure 12:
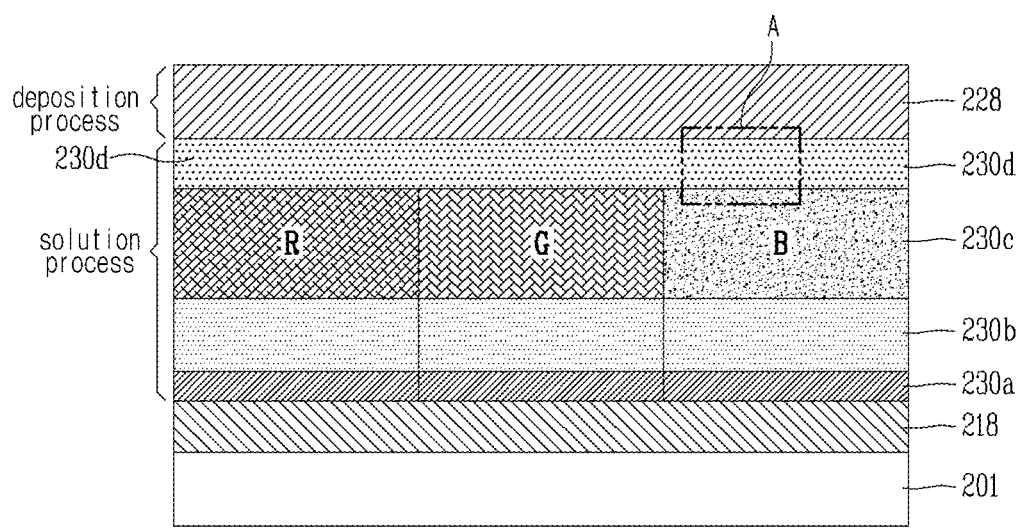
FIG. 12 is a cross-sectional view of an organic emitting diode according to the present invention.

FIG. 11 is a cross-sectional view of an OLED display device according to the present invention, and FIG. 12 is a cross-sectional view of an organic emitting diode according to the present invention.

Referring to FIGS. 11 and 12, the OLED display device includes a transistor TFT on the substrate 201 and an organic emitting diode OLED over the substrate 201.

The substrate 201 may be divided into the red, green and blue sub-pixels R, G and B, and the R, G and B sub-pixels may be regularly repeated. For example, the substrate 201 is formed of an insulating material such as a transparent plastic or a transparent polymer film to be flexible.

The transistor TFT as a driving element includes a semiconductor layer 224, a gate electrode 221, a source electrode 222 and a drain electrode 223.

The semiconductor layer 224 is formed on the substrate 201. For example, the semiconductor layer 224 may be formed of amorphous silicon, a poly-silicon, an oxide semiconductor or an organic semiconductor.

A buffer layer (not shown) may be formed between the substrate 201 and the semiconductor layer 224. The transistor TFT is protected from impurities, e.g., alkali ion, from the substrate 201 by the buffer layer.

A gate insulating layer 225a is formed on the semiconductor layer 224. For example, the gate insulating layer 225a may be formed of an inorganic insulating material such as silicon oxide or silicon nitride.

The gate electrode 221, a gate line (not shown) and a first capacitor electrode (not shown) are formed on the gate insulating layer 225a. The gate electrode 221 corresponds to the semiconductor layer 224.

Each of the gate electrode 221, the gate line and the first capacitor electrode is formed of a first metallic material having low resistance. For example, each of the gate electrode 221, the gate line and the first capacitor electrode may be formed of at least one of aluminum (Al), copper (Cu), molybdenum (Mo), chromium (Cr), gold (Au), titanium (Ti), nickel (Ni), neodymium (Nd) and their alloys and may have a single-layered structure or a multi-layered structure.

An interlayer insulating layer 225b is formed on the gate electrode 221, the gate line and the first capacitor electrode. For example, the interlayer insulating layer 225b may be formed of an inorganic material such as silicon oxide or silicon nitride, A data line (not shown), a power line (not shown), the source electrode 222, the drain electrode 223 and a second capacitor electrode (not shown) are formed on the interlayer insulating layer 225b.

The source and drain electrodes 222 and 223 are spaced apart from each other and electrically connected to the semiconductor layer 224, respectively. For example, first and second semiconductor contact holes are formed through the gate insulating layer 225a and the interlayer insulating layer 225b to expose both ends of the semiconductor layer 224, and the source and drain electrodes 222 and 223 contact the semiconductor layer 224 through the first and second semiconductor contact holes, respectively.

The second capacitor electrode overlaps the first capacitor electrode with the interlayer insulating layer 225b therebetween to form a storage capacitor.

Each of the data line, the power line, the source electrode 222, the drain electrode 223 and the second capacitor electrode may be formed of a second metallic material having low resistance. For example, each of the data line, the power line, the source electrode 222, the drain electrode 223 and the second capacitor electrode may be formed of at least one of Al, Cu, Mo, Cr, Au, Ti, Ni, Nd and their alloys and may have a single-layered structure or a multi-layered structure.

Although not shown, a switching element, which has substantially the same structure as the transistor TFT, is further formed in the R, G and B sub-pixels. The switching element is electrically connected to the gate line, the data line and the transistor TFT.

A passivation layer (or a planarization layer) 225c is formed over the substrate 201 including the data line, the power line, the source electrode 222, the drain electrode 223 and the second capacitor electrode, and an overcoat layer 225d is formed on the passivation layer 225c. A drain contact hole exposing the drain electrode 223 is formed through the overcoat layer 225d and the passivation layer 225c.

Each of the passivation layer 225c and the overcoat layer 22d is formed of an inorganic insulating material, e.g., silicon oxide or silicon nitride, or an organic insulating material, e.g., photo-acryl. One of the passivation layer 225c and the overcoat layer 22d may be omitted.

The organic emitting diode OLED including a first electrode 218, an emitting part 230 and a second electrode 228 is formed on the overcoat layer 225d. The organic emitting diode OLED is electrically connected to the transistor TFT.

The first electrode 218 is formed on the overcoat layer 225d to be separated in the R, G and B sub-pixel and is electrically connected to the drain electrode 223 of the transistor TFT through the drain contact hole.

The first electrode 218 providing a current (or a voltage) to the emitting part 230 defines an emission region of a pre-determined area.

The first electrode 218 includes a relatively high work function to serve as an anode. For example, the first electrode 218 may include a transparent conductive material, e.g., indium-tin-oxide (ITO) or indium-zinc-oxide (IZO), but it is not limited thereto.

In the top emission type OLED display device, a reflection electrode or a reflection layer may be formed under and/or on the first electrode 218. For example, each of the reflection electrode or the reflection layer may include aluminum-paladium-copper (APC) alloy. In other words, the first electrode 218 may have a double-layered structure including the transparent conductive electrode and the reflection electrode or layer under the transparent conductive electrode or a triple-layered structure including the transparent conductive electrode and the reflection electrode or layer under and the transparent conductive electrode.

A bank 225e is formed over the substrate 201 including the first electrode 218. The bank 225e covers edges of the first electrode 225e to surround the sub-pixel. Namely, the bank 225e has an opening in correspondence to a center of the first electrode 218. The bank 225e may include an organic material. The bank 225e may be formed of a photo-sensitive material including a black pigment to serve as a light shielding element.

The emitting part 230 and the second electrode 228 are sequentially formed over the substrate 201 including the bank 225e.

The emitting part 230 is disposed between the first and second electrodes 218 and 228. The holes from the first electrode 218 and the electrons from the second electrode 228 are combined in the emitting part 230 such that the emitting part 230 emits.

The emitting part 230 includes an EML 230c and an ETL 230d between the EML 230 and the second electrode 228 without an electron injection layer. Namely, the ETL 230d contacts the second electrode 228. In addition, the emitting part 230 may further include an HIL 230a and an HTL 230b sequentially stacked on the first electrode 218 and under the EML 230c.

The ETL 230d (referred to as "intervening layer" in another embodiment) includes an electron transporting material (not shown) and an electron injection material 232 (of FIG. 13) having an excellent electron property. In other words, the electron injection material 232 is doped into the ETL 230d.

The electron transporting material has a LUMO energy level of about 3.0 eV to about 2.0 eV and an electron mobility of about $10^{-5}$ cm$^2$/Vs to about $10^{-3}$ cm$^2$/Vs. In addition, the ETL 230d, where the electron injection material 232 is doped, has a triplet energy (T1) level of about 2.0 eV to about 2.5 eV. For example, the electron injection material 232 may include water-soluble or fat-soluble alkali metal.

When the emitting material layer 230c' is formed using an organic solvent (i.e., fat-soluble), the electron transporting layer 230d is formed using the water-soluble material to prevent damages on the emitting material layer 230c'. Alternatively, when the emitting material layer 230c' is formed using the water-soluble solvent, the electron transporting layer 230d is formed using the organic solvent (i.e., fat-soluble solvent) to prevent damages on the emitting material layer 230c'.

The electron injection material 232 has a concentration gradient (or a density gradient) in a vertical direction.

Namely, referring to FIG. 13, which an enlarged view of a portion "A" in FIG. 12, the electron injection material 232 has a first concentration (or a first density) in a lower portion 240, which is adjacent to the EML 230c, of the ETL 230d and a second concentration (or a second density) in an upper portion 250, which is adjacent to the second electrode 228, of the ETL 230d. The second concentration is larger than the first concentration.

For example, the electron injection material 232 has a first weight % of about 150 in the upper portion with respect to the electron transporting material and a second weight % of about 50 in the lower portion with respect to the electron transporting material.

In addition, the electron injection material 232 may have a concentration gradient in each of the lower and upper portions 240 and 250. Namely, in each of the lower and upper portions 240 and 250, the concentration (or the density) of the electron injection material 232 is reduced in a direction from the upper portion 250 to the lower portion 240. Alternatively, the electron injection material 232 may have the same concentration (or the density) in each of the lower and upper portions 240 and 250.

The ETL 230d includes the electron injection material 232 such that the electron injection property of the ETL 230d is increased. Accordingly, without the EIL, the organic emitting diode has a simple structure and a thin profile.

In addition, since the electron injection material 232 has the concentration gradient in the ETL 230d, the diffusion of the electron injection material 232 into the EML 230c is minimized.

To provide a desired electron injection property in the ETL 230d, the electron injection material 232 should be doped into the ETL 230d in a pre-determined concentration. In the organic emitting diode of the present invention, since the electron injection material 232 has a relatively low concentration in the lower portion 240, which is adjacent to the EML 230c, of the ETL 230d, the diffusion of the electron injection material 232 into the EML 230c is minimized. With the first concentration (>0) of the electron injection material 232 in the lower portion 240 of the ETL 230d, there is an advantage in the emitting efficiency by the electron injection material but there is no disadvantage in the emitting property by the diffusion of the electron injection material 232 into the EML 230c.

In other words, in the organic emitting diode of the present invention, the electron injection property of the ETL 230d is increased by doping the electron injection material, and the problem in the lifetime and the emitting efficiency is prevented by the concentration gradient of the electron injection material 232.

An ITO layer and an electron blocking layer (Liq, 1 nm) are sequentially deposited on a glass substrate, and an electron transporting layer (50 nm), where an electron injection material is doped in gradient, and a cathode (Al, 100 nm) are sequentially stacked on the electron blocking layer (example 2 (Ex2), electron only device).

An ITO layer and an electron blocking layer (Liq, 1 nm) are sequentially deposited on a glass substrate, and an electron transporting layer (50 nm) without an electron injection material and a cathode (Al, 100 nm) are sequentially stacked on the electron blocking layer (comparative example 3 (Com3), electron only device).

Figure 14:
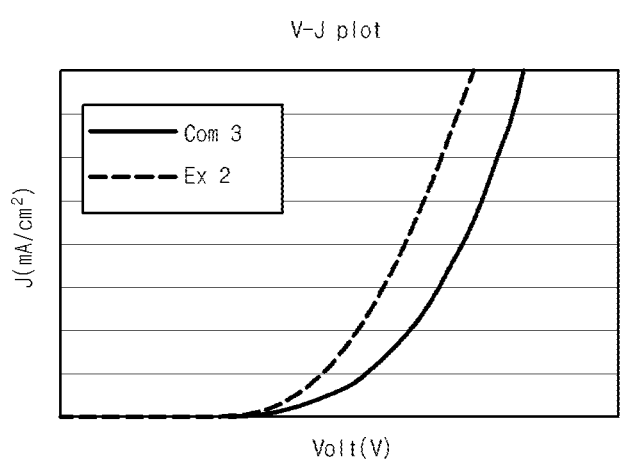
FIG. 14 is a graph of a current density according to a voltage in an organic emitting diode.

As shown in FIG. 14, which is a graph of a current density according to a voltage in an organic emitting diode, the current density in the organic emitting diode of "Ex2", where the electron injection material is doped into the electron transporting layer to have a concentration gradient, is higher than that in the organic emitting diode of "Com3". Namely, the emitting efficiency of the organic emitting diode and the OLED display device is improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic emitting diode, comprising:
   a first electrode;
   a second electrode facing the first electrode;
   an emitting material layer between the first and second electrodes; and
   an intervening layer between the emitting material layer and the second electrode, the intervening layer including:
      a base material; and
      an electron injection material,
   wherein the intervening layer contacts the second electrode,
   wherein the base material is a host material of the emitting material layer,
   wherein the electron injection material is an alkali metal, and
   wherein the intervening layer has:
      a LUMO energy level of about 3.0 eV to 2.6 eV, and
      a triplet energy level of about 2.0 eV to about 2.5 eV.

2. The organic emitting diode according to claim 1, wherein the intervening layer has an electron mobility of about $10^{-6}$ cm$^2$/Vs to about $10^{-4}$ cm$^2$/Vs.

3. The organic emitting diode according to claim 1, wherein the electron injection material has a first density in a lower portion, which is adjacent to the emitting material layer, of the intervening layer and a second density, which is larger than the first density, in an upper portion, which is adjacent to the second electrode, of the intervening layer.

4. An organic light emitting diode display device, comprising:
   a substrate including a plurality of sub-pixels;
   a transistor in each sub-pixel; and
   an organic emitting diode positioned in each sub-pixel and connected to the transistor, the organic emitting diode including:
      a first electrode;
      a second electrode facing the first electrode;
      an emitting material layer between the first and second electrodes; and
      an intervening layer between the emitting material layer and the second electrode, the intervening layer including:
         a base material; and
         an electron injection material,
      wherein the intervening layer contacts the second electrode,
      wherein the base material is a host material of the emitting material layer,
      wherein the electron injection material is an alkali metal, and
      wherein the intervening layer has:
         a LUMO energy level of about 3.0 eV to 2.6 eV, and
         a triplet energy level of about 2.0 eV to about 2.5 eV.

5. The organic light emitting diode display device according to claim 4, wherein the intervening layer has an electron mobility of about $10^{-6}$ cm$^2$/Vs to about $10^{-4}$ cm$^2$/Vs.

6. The organic light emitting diode display device according to claim 4, wherein the electron injection material has:
   a first density in a lower portion of the intervening layer, the lower portion being adjacent to the emitting material layer; and
   a second density, larger than the first density, in an upper portion of the intervening layer, the upper portion of the intervening layer being adjacent to the second electrode.

* * * * *